(12) United States Patent
Kamei

(10) Patent No.: US 7,452,740 B2
(45) Date of Patent: Nov. 18, 2008

(54) GALLIUM NITRIDE-BASED COMPOUND SEMICONDUCTOR LIGHT-EMITTING DEVICE AND NEGATIVE ELECTRODE THEREOF

(75) Inventor: Koji Kamei, Ichihara (JP)

(73) Assignee: Showa Denko K.K., Tokyo (JP)

( * ) Notice: Subject to any disclaimer, the term of this patent is extended or adjusted under 35 U.S.C. 154(b) by 143 days.

(21) Appl. No.: 10/581,751

(22) PCT Filed: Dec. 8, 2004

(86) PCT No.: PCT/JP2004/018689

§ 371 (c)(1),
(2), (4) Date: Jun. 6, 2006

(87) PCT Pub. No.: WO2005/057642

PCT Pub. Date: Jun. 23, 2005

(65) Prior Publication Data

US 2007/0108458 A1    May 17, 2007

Related U.S. Application Data

(60) Provisional application No. 60/529,751, filed on Dec. 17, 2003.

(30) Foreign Application Priority Data

Dec. 10, 2003   (JP)   ............... 2003-412236

(51) Int. Cl.
*H01L 21/00* (2006.01)
*H01L 21/44* (2006.01)
(52) U.S. Cl. .................... 438/46; 438/676; 438/29; 257/E21.053
(58) Field of Classification Search .............. 438/46, 438/47, 676, 29; 257/E21.053, E21.352
See application file for complete search history.

(56) References Cited

U.S. PATENT DOCUMENTS

| 5,422,500 A | 6/1995 | Tomikawa et al. |
| 6,299,056 B1 * | 10/2001 | Oota ........................ 228/177 |
| 6,806,112 B1 * | 10/2004 | Horng et al. .................. 438/29 |

(Continued)

FOREIGN PATENT DOCUMENTS

| JP | 5-291621 A | 11/1993 |
| JP | 2002-368271 A | 12/2002 |
| JP | 2003-110140 A | 4/2003 |
| JP | 2003-224298 A | 8/2003 |

OTHER PUBLICATIONS

English machine translation of JP 2003110140 A, Shinya, Sonobe., Nitride Semiconductor Light Emiting Element*

*Primary Examiner*—Scott B. Geyer
*Assistant Examiner*—Seahvosh J Nikmanesh
(74) *Attorney, Agent, or Firm*—Sughrue Mion, PLLC

(57) ABSTRACT

A gallium nitride-based compound semiconductor light-emitting device which includes an n-type semiconductor layer of a gallium nitride-based compound semiconductor, a light-emitting layer of a gallium nitride-based compound semiconductor and a p-type semiconductor layer of a gallium nitride-based compound semiconductor formed on a substrate in this order, and has a negative electrode and a positive electrode provided on the n-type semiconductor layer and the p-type semiconductor layer, respectively; wherein the negative electrode includes a bonding pad layer and a contact metal layer which is in contact with the n-type semiconductor layer, and the contact metal layer is composed of Cr or a Cr alloy and formed through sputtering.

1 Claim, 1 Drawing Sheet

U.S. PATENT DOCUMENTS 6,861,275 B2 * 3/2005 Chiyo .......................... 438/47
2003/0194826 A1 10/2003 Chiyo
2004/0115917 A1 * 6/2004 Shibata et al. .............. 438/604

* cited by examiner

GALLIUM NITRIDE-BASED COMPOUND SEMICONDUCTOR LIGHT-EMITTING DEVICE AND NEGATIVE ELECTRODE THEREOF

CROSS REFERENCE TO RELATED APPLICATION

This application is an application filed under 35 U.S.C. §111(a) claiming benefit, pursuant to 35 U.S.C. §119(e)(1), of the filing date of the Provisional Application No. 60/529,751 filed on Dec. 17, 2003, pursuant to 35 U.S.C. §111(b).

TECHNICAL FIELD

The present invention relates to a gallium nitride-based compound semiconductor light-emitting device, and more particularly to a flip-chip-type gallium nitride-based compound semiconductor light-emitting device having a negative electrode that exhibits excellent characteristics and can be fabricated with high productivity.

BACKGROUND ART

In recent years, gallium nitride-based compound semiconductors represented by the formula $Al_xGa_yIn_{1-x-y}N$ ($0 \leq x \leq 1$, $0 \leq y \leq 1$, $x+y \leq 1$) have become of interest as materials for producing a light-emitting diode (LED) which emits ultraviolet to blue light, or green light. Through employment of such a compound semiconductor, ultraviolet light, blue light, or green light of high emission intensity can be obtained; such high-intensity light has conventionally been difficult to attain. Unlike the case of a GaAs light-emitting device, such a gallium nitride-based compound semiconductor is generally grown on a sapphire substrate (i.e., an insulating substrate); hence, an electrode cannot be provided on the back surface of the substrate. Therefore, both a negative electrode and a positive electrode must be provided on semiconductor layers formed through crystal growth on the substrate.

In the case of the gallium nitride-based compound semiconductor device, the sapphire substrate is permeable with respect to emitted light. Therefore, attention is drawn to a flip-chip-type light-emitting device, which is configured by mounting the semiconductor device on a lead frame and the like such that the electrode face the frame, whereby emitted light is emitted through the sapphire substrate.

FIG. 1 is a schematic representation showing a general structure of a flip-chip-type light-emitting device. Specifically, the light-emitting device includes a substrate 1, a buffer layer 2, an n-type semiconductor layer 3, a light-emitting layer 4, and a p-type semiconductor layer 5, the layers being formed atop the substrate through crystal growth. A portion of the light-emitting layer 4 and a portion of the p-type semiconductor layer 5 are removed through etching, thereby exposing a portion of the n-type semiconductor layer 3 to the outside. A positive electrode 10 is formed on the p-type semiconductor layer 5, and a negative electrode 20 is formed on the exposed portion of the n-type semiconductor layer 3. The light-emitting device is mounted on, for example, a lead frame such that the electrodes face the frame, followed by bonding.

During mounting of a flip-chip-type light-emitting device, a negative electrode is heated to some hundreds of degrees Celsius. Therefore, the negative electrode of a flip-chip-type light-emitting device is required to resist a deterioration, in characteristics, caused by heating.

As an exemplary negative electrode which provides excellent Ohmic contact with a gallium nitride-based compound semiconductor, there has been known such an electrode that is formed through vapor deposition of Al, Cr, and Ti on an n-type gallium nitride-based compound semiconductor layer (see, for example, Japanese Patent Application Laid-Open (kokai) No. 5-291621). However, when heated, the negative electrode has deteriorated characteristics. Another known negative electrode is formed through vapor deposition, on an n-type gallium nitride-based compound semiconductor layer, of an undercoat layer formed of at least one metal selected from the group consisting of V, Nb, Zr, and Cr, or formed of an alloy containing the metal and, on the undercoat layer, a main electrode formed of a metal different from the metal forming the undercoat layer, followed by thermally annealing the formed multi-layer structure (see, for example, Japanese Patent Application Laid-Open (kokai) No. 10-112555). However, as the above method includes a thermal annealing step after formation of a negative electrode, productivity of the electrode is unsatisfactory.

DISCLOSURE OF INVENTION

An object of the present invention is to provide a negative electrode which attains excellent Ohmic contact with an n-type gallium nitride-based compound semiconductor layer and which resists a deterioration, in characteristics, which would be caused by heating. Another object of the invention is to provide a gallium nitride-based compound semiconductor light-emitting device having the negative electrode.

The present invention provides the following.

(1) A gallium nitride-based compound semiconductor light-emitting device comprising an n-type semiconductor layer of a gallium nitride-based compound semiconductor, a light-emitting layer of a gallium nitride-based compound semiconductor and a p-type semiconductor layer of a gallium nitride-based compound semiconductor formed on a substrate in this order, and having a negative electrode and a positive electrode provided on the n-type semiconductor layer and the p-type semiconductor layer, respectively; wherein the negative electrode comprises a bonding pad layer and a contact metal layer which is in contact with the n-type semiconductor layer, and the contact metal layer is composed of Cr or a Cr alloy and formed through sputtering.

(2) A gallium nitride-based compound semiconductor light-emitting device as described in (1) above, wherein the Cr alloy includes Cr and a metallic element having a work function of 4.5 eV or less.

(3) A gallium nitride-based compound semiconductor light-emitting device as described in (2) above, wherein the metallic element having a work function of 4.5 eV or less is at least one metallic element selected from the group consisting of Al, Ti, Si, Mn, Fe, Co, Ni, Cu, Zr, Nb, Mo, Hf, Ta, W, and V.

(4) A gallium nitride-based compound semiconductor light-emitting device as described in (2) above, wherein the metallic element having a work function of 4.5 eV or less is at least one metallic element selected from the group consisting of Al, V, Nb, Mo, W, and Mn.

(5) A gallium nitride-based compound semiconductor light-emitting device as described in any one of (1) to (4) above, wherein the Cr alloy has a Cr content of 1 mass % or more and less than 100 mass %.

(6) A gallium nitride-based compound semiconductor light-emitting device as described in (5) above, wherein the Cr alloy has a Cr content of 10 mass % or more.

(7) A gallium nitride-based compound semiconductor light-emitting device as described in any one of (1) to (6) above, wherein the contact metal layer has a thickness of 1 to 500 nm.

(8) A gallium nitride-based compound semiconductor light-emitting device as described in (7) above, wherein the contact metal layer has a thickness of 10 nm or more.

(9) A gallium nitride-based compound semiconductor light-emitting device as described in any one of (1) to (8)

above, wherein the bonding pad layer is formed of a metal selected from the group consisting of Au, Al, Ni, and Cu, or an alloy containing the metal.

(10) A gallium nitride-based compound semiconductor light-emitting device as described in any one of (1) to (9) above, wherein the bonding pad layer has a thickness of 100 to 1,000 nm.

(11) A gallium nitride-based compound semiconductor light-emitting device as described in (10) above, wherein the bonding pad layer has a thickness of 200 to 500 nm.

(12) A gallium nitride-based compound semiconductor light-emitting device as described in any one of (1) to (11) above, wherein an Au—Sn alloy layer is provided on the bonding pad layer.

(13) A gallium nitride-based compound semiconductor light-emitting device as described in (12) above, wherein the Au—Sn alloy layer has a thickness of 200 nm or more.

(14) A gallium nitride-based compound semiconductor light-emitting device as described in any one of (1) to (11) above, wherein a lead free solder layer is provided on the bonding pad layer.

(15) A gallium nitride-based compound semiconductor light-emitting device as described in (14) above, wherein the lead free solder layer has a thickness of 200 nm or more.

(16) A gallium nitride-based compound semiconductor light-emitting device as described in any one of (1) to (15) above, wherein the light-emitting device has an adhesion layer formed of Ti between the contact metal layer and the bonding pad layer.

(17) A gallium nitride-based compound semiconductor light-emitting device as described in (16) above, wherein the adhesion layer has a thickness of 1 to 100 nm.

(18) A gallium nitride-based compound semiconductor light-emitting device as described in (17) above, wherein the adhesion layer has a thickness of 10 nm or more.

(19) A gallium nitride-based compound semiconductor light-emitting device as described in any one of (1) to (15) above, wherein the light-emitting device has a barrier layer between the contact metal layer and the bonding pad layer.

(20) A gallium nitride-based compound semiconductor light-emitting device as described in any one of (12) to (18) above, wherein the light-emitting device has a barrier layer between the bonding pad layer and the Au—Sn alloy layer or the lead free solder layer.

(21) A gallium nitride-based compound semiconductor light-emitting device as described in (19) or (20) above, wherein the barrier layer is formed of a metal selected from the group consisting of Ti, Zr, Hf, Ta, W, Re, Os, Ir, Pt, Fe, Co, Ni, Ru, Rh, and Pd, or an alloy containing the metal.

(22) A gallium nitride-based compound semiconductor light-emitting device as described in (21) above, wherein the barrier layer is formed of a metal selected from the group consisting of Ti, Ta, W, and Pt, or an alloy containing the metal.

(23) A gallium nitride-based compound semiconductor light-emitting device as described in any one of (19) to (22) above, wherein the barrier layer has a thickness of 10 to 500 nm.

(24) A gallium nitride-based compound semiconductor light-emitting device as described in (23) above, wherein the barrier layer has a thickness of 50 to 300 nm.

(25) A gallium nitride-based compound semiconductor light-emitting device as described in any one of (1) to (24) above, wherein the light-emitting device is of a flip-chip type.

(26) A negative electrode for use in a gallium nitride-based compound semiconductor light-emitting device comprising a bonding pad layer and a contact metal layer which is in contact with the n-type semiconductor layer, wherein the contact metal layer is composed of Cr or a Cr alloy and formed through sputtering.

(27) A negative electrode for use in a gallium nitride-based compound semiconductor light-emitting device as described in (26), wherein the light-emitting device is of a flip-chip type.

(28) A method for manufacturing a gallium nitride-based compound semiconductor light-emitting device comprising
(a) forming an n-type semiconductor layer of a gallium nitride-based compound semiconductor, a light-emitting layer of a gallium nitride-based compound semiconductor and a p-type semiconductor layer of a gallium nitride-based compound semiconductor on a substrate in this order,
(b) providing a positive electrode and a negative electrode, which comprises a bonding pad layer and a contact metal layer, on the p-type semiconductor layer and the n-type semiconductor layer, respectively; wherein the contact metal layer is forming through sputtering Cr or a Cr alloy on the n-type semiconductor layer to attain Ohmic contact without performing an annealing.

(29) A lamp comprising a gallium nitride compound semiconductor light-emitting device as described in any one of (1) to (25).

The negative electrode according to the present invention has a contact metal layer comprising Cr or a Cr alloy and formed through sputtering. Thus, the negative electrode attains excellent Ohmic contact with an n-type gallium nitride-based compound semiconductor layer and is not deteriorated, in characteristics, by heating. Such excellent Ohmic contact between the negative electrode of the present invention and the n-type gallium nitride-based compound semiconductor layer can be provided without performing annealing. Therefore, the gallium nitride-based compound semiconductor light-emitting device of the present invention can be produced with remarkably high efficiency.

BEST MODES FOR CARRYING OUT THE INVENTION

Figure 1:
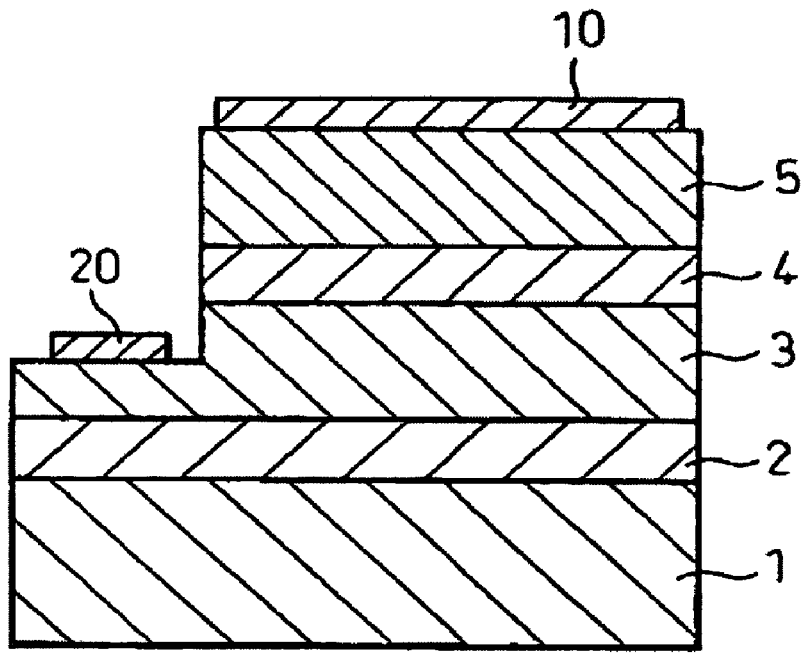
FIG. 1 is a schematic view showing a general structure of a conventional flip-chip-type compound semiconductor light-emitting device.

In the present invention, no particular limitations are imposed on the gallium nitride-based compound semiconductor layers stacked on a substrate, and the semiconductor stacked layers may have a conventionally known structure as shown in FIG. 1; i.e., a stacked structure including a buffer layer 2, an n-type semiconductor layer 3, a light-emitting layer 4, and a p-type semiconductor layer 5, the layers being formed atop a substrate 1 through crystal growth. No particular limitation is imposed on the type of the substrate, and any conventionally known substrates such as a sapphire substrate and an SiC substrate may be employed. No particular limitation is imposed on the type of the gallium nitride-based compound semiconductor, and conventionally known gallium nitride-based compound semiconductors represented by formula: $Al_xGa_yIn_{1-x-y}N$ ($0 \leq x \leq 1$, $0 \leq y \leq 1$, $x+y \leq 1$) may be employed.

Figure 2:
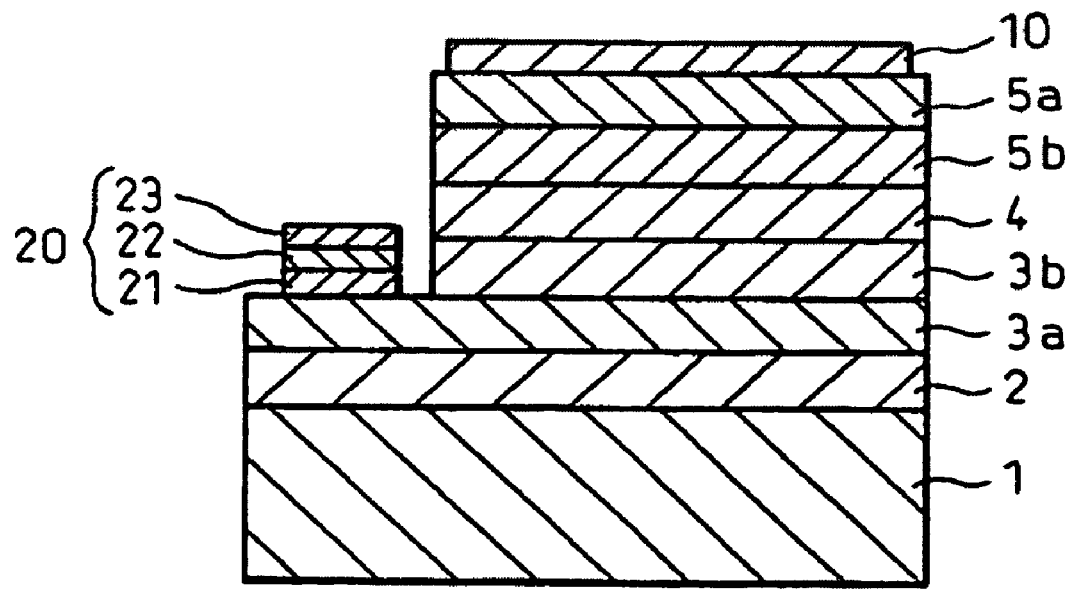
FIG. 2 is a schematic view showing an exemplary flip-chip-type gallium nitride-based compound semiconductor light-emitting device according to the present invention.

FIG. 2 shows one exemplary employable stacked structure in which an AlN buffer layer 2, an n-type GaN contact layer 3a, an n-type GaN lower cladding layer 3b, an InGaN light-emitting layer 4, a p-type AlGaN upper cladding layer 5b, and a p-type GaN contact layer 5a are sequentially stacked on a sapphire substrate 1. No particular limitation is imposed on the composition and structure of a positive electrode 10 to be provided atop the contact layer 5a, and a positive electrode having a conventional composition and structure (e.g., Al) may be employed.

A portion of the contact layer 5a, that of the upper cladding layer 5b, that of the light-emitting layer 4, and that of the lower cladding layer 3b, these layers being formed of the aforementioned gallium nitride-based compound semiconductor, are removed through etching, and a negative electrode 20 is provided on the thus-exposed portion of the contact layer 3a. The negative electrode 20 is constituted of a contact metal layer 21, an adhesion layer 22, and a bonding pad layer 23.

According to the present invention, the negative electrode at least contains two layers; i.e., a contact metal layer which is in Ohmic contact with an n-type semiconductor layer, and a bonding pad layer for establishing electric contact with a circuit substrate, a lead frame, etc., and the contact metal layer is composed of Cr or a Cr alloy and formed through sputtering. As formation of the contact metal layer through sputtering promotes alloying of the n-type GaN layer with the contact metal layer, a low contact resistance can be attained after formation of the contact metal layer without carrying out annealing.

The contact metal layer preferably has a thickness of 1 nm or more. A layer thickness of 5 nm or more is particularly preferred, from the viewpoint of attainment of low resistance. The thickness is more preferably 10 nm or more, as a constant low resistance can then be attained. However, when the thickness is excessively large, productivity decreases. Thus, the thickness is preferably 500 nm or less, more preferably 200 nm or less.

The Cr alloy is preferably an Cr alloy containing a metallic element having a work function of 4.5 eV or less, since such a Cr alloy has low specific contact resistance. Examples of the metallic element having a work function of 4.5 eV or less include Al, Ti, Si, Mn, Fe, Co, Ni, Cu, Zr, Nb, Mo, Hf, Ta, W, and V. Among them, Al, V, Nb, Mo, W, and Mn are particularly preferred.

The Cr content of the Cr alloy is preferably 1 mass % or more and less than 100 mass %. Particularly when thermal-induced deterioration in characteristics of the light-emitting device is to be prevented, the Cr content is preferably controlled to 10 mass % or more. In order to more reliably prevent deterioration in characteristics, the Cr content is preferably controlled to 20 mass % or more. Also, as a reflectivity of the Cr alloy becomes higher after heating, it is preferable that the Cr content is high.

Sputtering may be performed by means of a conventionally known sputtering apparatus under appropriately selected conditions which are known. Specifically, gallium nitride-based compound semiconductor layers are stacked on a substrate, and a portion of an n-type semiconductor layer is exposed through etching. The thus processed substrate is placed in a chamber, and the substrate temperature is predetermined so as to fall within a range of room temperature to 500° C. The substrate temperature is preferably controlled to about room temperature. The chamber is evacuated until the degree of vacuum is $10^{-4}$ to $10^{-7}$ Pa. Examples of employable sputtering gas include He, Ne, Ar, Kr, and Xe. Among them, Ar is preferred, from the viewpoint of availability. Any one of these gases is introduced into the chamber, and the internal pressure is adjusted to 0.1 to 10 Pa. Under these conditions, discharging is performed. The internal pressure is preferably adjusted to 0.2 to 5 Pa. The electric power input to the apparatus preferably falls within a range of 0.2 to 2.0 kW. During sputtering, the thickness of the formed layer can be controlled by tuning discharge time and input electric power. The sputtering target to be employed preferably has an oxygen content of 10,000 ppm or less, as the oxygen content of the formed layer decreases. The oxygen content of the sputtering target is more preferably 6,000 ppm or less. When an alloy layer is formed through sputtering, in a preferred manner, an alloy having a target composition is prepared and formed into a sputtering target. The sputtering target having a target composition identical to that of the alloy layer is sputtered.

The contact resistance between the contact metal layer and an n-type GaN semiconductor layer is greatly affected by the degree of removal of oxide film formed spontaneously on the surface of the n-type GaN semiconductor layer. The surface of the GaN semiconductor layer is oxidized in the atmosphere, thereby forming natural oxide film. Even in the case where the thus-formed oxide film is removed through etching or similar means, the surface is oxidized again, if the surface is exposed to the atmosphere before formation of an electrode. Since the oxide film formed on GaN serves as an insulator, the contact resistance at the interface between the electrode and GaN increases, if the entire GaN surface is covered with the oxide film. Therefore, removal of oxide film formed on the surface of an n-type semiconductor layer before sputtering is a key issue.

The bonding pad layer is preferably formed of a metal selected from the group consisting of Au, Al, Ni, and Cu, or formed of an alloy containing the metal, from the viewpoint of attainment of good contact with a bump. The bonding pad layer preferably has a thickness of 100 to 1,000 nm, from the viewpoint of productivity. The thickness is preferably 200 to 800 nm, particularly preferably 200 to 500 nm.

In order to improve adhesion between the contact metal layer and the bonding pad layer, an adhesion layer formed of Ti preferably intervenes between the two layers. The adhesion layer, if employed, preferably has a thickness of 1 to 100 nm. When the thickness is less than 1 nm, the effect of adhesion is poor, whereas when the thickness is more than 100 nm, the Ti film is oxidized in the case where the light-emitting device is in a heated state, and in some cases, the electrical characteristics may be impaired. From the viewpoint of reliable adhesion effect, a thickness of 5 nm or more is preferred, with 10 nm or more being particularly preferred.

An Au—Sn alloy layer or a lead free solder layer can be preferably provided on the bonding pad layer. This layer functions as an adhesion layer in order to adhere the light-emitting device to a sub-mount. This layer preferably has a thickness of 200 nm or more, from the viewpoint of attaining the adhesion. Also, this layer preferably has a thickness of 5 μm or less, from the viewpoint of productivity.

Even in a case of providing the Au—Sn alloy layer or the lead free solder layer, a negative electrode is heated to 300~400° C. for some minutes during mounting. By the heat generated during mounting, a Cr atom in the contact metal layer may diffuse to the bonding pad layer and the Au—Sn alloy layer or the lead free solder layer.

Therefore, in order to prevent the Cr diffusion, a barrier layer can be preferably provided between the contact metal layer and the bonding pad layer or between the bonding pad layer and the Au—Sn alloy layer or the lead free solder layer. The barrier layer is preferably formed of a metal selected from the group consisting of Ti, Zr, Hf, Ta, W, Re, Os, Ir, Pt, Fe, Co, Ni, Ru, Rh, and Pd, or formed of an alloy containing the metal. Among these metals, Ti, Ta, W, and Pt are more preferable. The barrier layer preferably has a thickness of 10 nm or more, from the viewpoint of forming a uniform single layer. Also, it preferably has a thickness of 500 nm or less, from the viewpoint of productivity. The thickness is more preferably 50 to 300 nm.

When the above-mentioned adhesion layer of Ti is provided, it also functions as the barrier layer.

No particular limitation is imposed on the method of forming the bonding pad layer, the adhesion layer and the barrier layer, and any conventionally known method such as sputtering or vapor deposition may be employed. However, as the contact metal layer is formed through sputtering, preferably, these two layers are subsequently formed also through sputtering for the purpose of simplifying the steps. Also, no particular limitation is imposed on the method of forming the Au—Sn alloy layer or the lead free solder layer, and any conventionally known method such as vapor deposition, plating and a coating method using a paste, may be employed.

The present inventive gallium nitride-based compound semiconductor light-emitting device can preferably form a lamp.

EXAMPLES

The present invention will next be described in more detail by way of Examples and Comparative Examples. Table 1 shows negative electrode materials employed in the Examples and Comparative Examples, the electrode formation method, and evaluation of characteristics immediately after formation of film and after a heating test. Needless to say, these Examples and Comparative Examples should not be construed as limiting the invention.

FIG. 2 is a schematic view showing a gallium nitride-based compound semiconductor light-emitting device produced in the present Example.

The gallium nitride-based compound semiconductor stacked structure employed for fabricating the light-emitting device was produced through the following procedure: an AlN buffer layer 2 was formed on a sapphire substrate 1; and an n-type GaN contact layer 3a, an n-type GaN lower cladding layer 3b, an InGaN light-emitting layer 4, a p-type AlGaN upper cladding layer 5b, and a p-type GaN contact layer 5a were successively formed atop the buffer layer 2. The contact layer 3a is formed of n-type GaN doped with Si ($7 \times 10^{18}/cm^3$), the lower cladding layer 3b is formed of n-type GaN doped with Si ($5 \times 10^{18}/cm^3$), and the light-emitting layer 4, having a single quantum well structure, is formed of $In_{0.95}Ga_{0.05}N$. The upper cladding layer 5b is formed of p-type $Al_{0.25}Ga_{0.75}N$ doped with Mg ($1 \times 10^{18}/cm^3$). The contact layer 5a is formed of p-type GaN doped with Mg ($5 \times 10^9/cm^3$). Stacking of these layers was performed by means of MOCVD under typical conditions which are well known in the art.

A positive electrode 10 and a negative electrode 20 were provided on the gallium nitride-based compound semiconductor stacked structure through the below-described procedure, to thereby fabricate a flip-chip-type gallium nitride-based compound semiconductor light-emitting device.

Firstly, in order to remove the oxide film on the contact layer 5a, the gallium nitride-based compound semiconductor stacked structure was treated in boiling concentrated HCl for 10 minutes.

Then, the positive electrode 10 made of Al was formed on the contact layer 5a through the following procedure. A resist was uniformly applied onto the entire surface of the contact layer, and a portion of the resist provided on the region where the positive electrode was to be formed was removed through a conventional lithographic technique. The thus-formed structure was immersed in buffered hydrofluoric acid (BHF) at room temperature for one minute, followed by forming a positive electrode in the form of film in a vacuum sputtering apparatus. The operational conditions employed for forming the electrode through sputtering are as follows.

The chamber was evacuated to a degree of vacuum of $10^{-6}$ Pa. A substrate was placed in the chamber, and Ar serving as a sputtering gas was fed into the chamber. After the internal pressure of the chamber was controlled to 0.5 Pa, discharge was caused by inputting an electric power of 0.25 kW. The thickness of the formed layer was adjusted to 100 nm by tuning the discharge time and supplied electric power. The structure was removed from the sputtering apparatus, and a portion of metallic film other than the positive electrode region was removed along with the resist through a lift-off technique.

Subsequently, a negative electrode was formed on the contact layer 3a through the following procedure.

Firstly, an etching mask was formed in the positive electrode through the following procedure. After uniform provision of a resist on the entire surface, a portion of the resist corresponding to a region slightly wider than the positive electrode region was removed through a conventional lithography technique. The structure was placed in a vacuum vapor deposition apparatus, and an Ni layer and a Ti layer were stacked, through the electron beam method, to thicknesses of about 50 nm and 300 nm, respectively, under a pressure of $4 \times 10^{-4}$ Pa or lower. Thereafter, a portion of metal film other than the positive electrode region was removed along with the resist through the lift-off technique. The etching mask serves as a protective layer for protecting the positive electrode from plasma-induced damage during reactive ion dry etching.

Subsequently, the contact layer 3a was exposed, and a negative electrode was formed on the thus-exposed portion through the following procedure. Specifically, the semiconductor stacked structure was etched through reactive ion dry etching until the contact layer 3a was exposed, and the resultant stacked structure was removed from the dry etching apparatus. The aforementioned etching mask was removed by use of nitric acid or hydrofluoric acid.

After uniform provision of a resist on the entire surface, a portion of the resist corresponding to the exposed contact layer 3a region was removed through a conventional lithography technique. Subsequently, through the aforementioned sputtering method, a Cr contact metal layer 21, a Ti adhesion layer 22, and an Au bonding pad layer 23 were formed at a thickness of 100 nm, 20 nm, and 300 nm, respectively. Thereafter, a portion of metal film other than the negative electrode region was removed along with the resist, thereby fabricating the gallium nitride-based compound semiconductor light-emitting device of the present invention.

In a similar manner, gallium nitride-based compound semiconductor light-emitting devices were fabricated by use of contact metal layer materials, adhesion layer materials, and bonding pad layer materials listed in Table 1. Specific contact resistance values of the thus-produced light-emitting devices were determined through the circular TLM method. The results are also shown in Table 1.

TABLE 1

| Contact metal layer | Adhesion layer | Bonding pad layer | Film formation | After film formation | | After heating | |
|---|---|---|---|---|---|---|---|
| | | | | Type | Specific contact resistance $\Omega \cdot cm^2$ | Type | Specific contact resistance $\Omega \cdot cm^2$ |
| Cr | — | Al | VD | Ohmic | $4 \times 10^{-5}$ | Schottky | |
| Cr | — | Au | VD | Ohmic | $3 \times 10^{-5}$ | Schottky | |
| Cr | Ti | Au | VD | Ohmic | $3 \times 10^{-5}$ | Schottky | |

TABLE 1-continued

| Contact metal layer | Adhesion layer | Bonding pad layer | Film formation | After film formation | | After heating | |
|---|---|---|---|---|---|---|---|
| | | | | Type | Specific contact resistance $\Omega \cdot cm^2$ | Type | Specific contact resistance $\Omega \cdot cm^2$ |
| Cr | — | Al | SPT | Ohmic | $4 \times 10^{-5}$ | Ohmic | $3 \times 10^{-5}$ |
| Cr | — | Au | SPT | Ohmic | $3 \times 10^{-5}$ | Ohmic | $3 \times 10^{-5}$ |
| Cr | Ti | Au | SPT | Ohmic | $3 \times 10^{-5}$ | Ohmic | $3 \times 10^{-5}$ |
| $Cr_{20}Al_{80}$ | Ti | Au | SPT | Ohmic | $4 \times 10^{-5}$ | Ohmic | $3 \times 10^{-5}$ |
| $Cr_{80}Al_{20}$ | Ti | Au | SPT | Ohmic | $4 \times 10^{-5}$ | Ohmic | $3 \times 10^{-5}$ |
| Al | Ti | Au | SPT | Ohmic | $3 \times 10^{-5}$ | Ohmic | $4 \times 10^{-5}$ |
| $Cr_{50}Ti_{50}$ | Ti | Au | SPT | Ohmic | $2 \times 10^{-5}$ | Ohmic | $3 \times 10^{-5}$ |
| $Cr_{50}Si_{50}$ | Ti | Au | SPT | Ohmic | $4 \times 10^{-5}$ | Ohmic | $3 \times 10^{-5}$ |
| $Cr_{50}Mn_{50}$ | Ti | Au | SPT | Ohmic | $4 \times 10^{-5}$ | Ohmic | $4 \times 10^{-5}$ |
| $Cr_{50}Fe_{50}$ | Ti | Au | SPT | Ohmic | $5 \times 10^{-5}$ | Ohmic | $4 \times 10^{-5}$ |
| $Cr_{50}Co_{50}$ | Ti | Au | SPT | Ohmic | $5 \times 10^{-5}$ | Ohmic | $5 \times 10^{-5}$ |
| $Cr_{50}Ni_{50}$ | Ti | Al | SPT | Ohmic | $5 \times 10^{-5}$ | Ohmic | $5 \times 10^{-5}$ |
| $Cr_{50}Cu_{50}$ | Ti | Au | SPT | Ohmic | $6 \times 10^{-5}$ | Ohmic | $6 \times 10^{-5}$ |
| $Cr_{50}Zr_{50}$ | Ti | Au | SPT | Ohmic | $3 \times 10^{-5}$ | Ohmic | $4 \times 10^{-5}$ |
| $Cr_{50}Nb_{50}$ | Ti | Au | SPT | Ohmic | $3 \times 10^{-5}$ | Ohmic | $3 \times 10^{-5}$ |
| $Cr_{50}Mo_{50}$ | Ti | Au | SPT | Ohmic | $2 \times 10^{-5}$ | Ohmic | $2 \times 10^{-5}$ |
| $Cr_{50}Hf_{50}$ | Ti | Au | SPT | Ohmic | $4 \times 10^{-5}$ | Ohmic | $3 \times 10^{-5}$ |
| $Cr_{50}Ta_{50}$ | Ti | Au | SPT | Ohmic | $4 \times 10^{-5}$ | Ohmic | $3 \times 10^{-5}$ |
| $Cr_{50}W_{50}$ | Ti | Au | SPT | Ohmic | $4 \times 10^{-5}$ | Ohmic | $3 \times 10^{-5}$ |

In the film formation method in Table 1, "VD" refers to a vapor deposition method for forming a comparative negative electrode. The comparative electrode was formed by placing a substrate in a furnace and depositing a metal through a vapor deposition method in a vacuum of $10^{-4}$ Pa or lower. The "SPT" refers to the sputtering method. The heating test was performed in a RTA furnace in the atmosphere at 300° C. for one minute.

When the contact metal layer is formed through vapor deposition, the as-formed film exhibits Ohmic contact characteristics. However, after the heating test has been performed, the film exhibits Schottky contact characteristics, and the resistance value is considerably impaired. In contrast, according to the present invention, the film formed through sputtering exhibits Ohmic contact characteristics after formation of the film and after performance of the heating test, and the resistance value remains at a low level. When the contact metal layer is formed through sputtering by use of a Cr—Al alloy target, the excellent characteristics are maintained even at a Cr content of as low as 20%. Through employment of a Cr—Mo alloy, the resistance value further decreases, and such a low resistance value is maintained even after performance of the heating test.

INDUSTRIAL APPLICABILITY

The flip-chip-type gallium nitride-based compound semiconductor light-emitting device provided according to the present invention is useful for fabricating light-emitting diodes, lamps, etc.

The invention claimed is:

1. A method for manufacturing a gallium nitride-based compound semiconductor light-emitting device comprising
   (a) forming an n-type semiconductor layer of a gallium nitride-based compound semiconductor, a light-emitting layer of a gallium nitride-based compound semiconductor and a p-type semiconductor layer of a gallium nitride-based compound semiconductor on a substrate in this order,
   (b) providing a positive electrode and a negative electrode, which comprises a bonding pad layer and a contact metal layer, on the p-type semiconductor layer and the n-type semiconductor layer, respectively;
   wherein the contact metal layer is forming through sputtering Cr or a Cr alloy on the n-type semiconductor layer to attain Ohmic contact without performing annealing.

* * * * *